(12) United States Patent
Barnard et al.

(10) Patent No.: US 10,860,066 B1
(45) Date of Patent: Dec. 8, 2020

(54) INFORMATION HANDLING SYSTEM HOUSING SPLIT ANCHOR AUTOMATIC STATE-HOLDING LATCH

(71) Applicant: Dell Products L.P., Round Rock, TX (US)

(72) Inventors: Christopher T. Barnard, Austin, TX (US); Mark A. Smith, Pflugerville, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 16/441,462

(22) Filed: Jun. 14, 2019

(51) Int. Cl.
*H05K 5/00* (2006.01)
*G06F 1/16* (2006.01)
*F16M 11/22* (2006.01)
*H05K 5/02* (2006.01)
*H05K 5/03* (2006.01)

(52) U.S. Cl.
CPC .......... *G06F 1/1679* (2013.01); *F16M 11/22* (2013.01); *G06F 1/1656* (2013.01); *H05K 5/0221* (2013.01); *H05K 5/0247* (2013.01); *H05K 5/03* (2013.01)

(58) Field of Classification Search
CPC ....................................................... H05K 5/00
See application file for complete search history.

(56) References Cited

U.S. PATENT DOCUMENTS

| 5,627,727 | A | 5/1997 | Aguilera et al. |
| 9,207,724 | B2 | 12/2015 | Coster et al. |
| 10,312,483 | B2 | 6/2019 | Chaney |
| 2004/0249990 | A1 | 12/2004 | Yin |
| 2008/0036218 | A1* | 2/2008 | Liang .................. E05B 17/0033 292/336.3 |

FOREIGN PATENT DOCUMENTS

JP         2008176597 A    *  7/2008

* cited by examiner

*Primary Examiner* — Jerry Wu
(74) *Attorney, Agent, or Firm* — Zagorin Cave LLP; Robert W. Holland (57) ABSTRACT

A display stand cavity accepts an information handling system secured with a cover over the cavity held in place by a latch. The latch interacts with a locking element of the display stand to maintain the cover in position and slides to an unlocked position to release the cover for removal. An anchor engages with the latch to hold the latch in the unlocked position while the cover remains in place. The anchor releases the latch when the cover is removed from the display stand. If the cover remains in place, application of greater than a predetermined force on the latch towards the closed position overcomes the anchor to re-engage the latch to couple the cover to the display stand.

15 Claims, 9 Drawing Sheets

INFORMATION HANDLING SYSTEM HOUSING SPLIT ANCHOR AUTOMATIC STATE-HOLDING LATCH

BACKGROUND OF THE INVENTION

Field of the Invention

The present invention relates in general to the field of information handling system housings, and more particularly to an information handling system housing split anchor automatic state holding latch.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Information handling systems integrate processing components, that cooperate to process information for output to an end user. A typical information handling system includes a central processor unit (CPU) that executes instructions to process information and a random access memory (RAM) that stores the instructions and information. The CPU and RAM are supported with a variety of other processing components that support their operation, such as a chipset that manages operation of the CPU, a graphics processor unit (GPU) that further processes information for output as visual images, an embedded controller that manages input devices, power controller that supplies power to the processing components and other types of processing components to support communication between the processing components and with external networks and peripherals. Generally, the processing components interface with each other through a motherboard that integrates wirelines and that includes sockets, ports and/or cables to support interactions with external devices and an external power source.

Typically, information handling systems are built into a housing that protects the motherboard and processing components and that includes ports and/or cables to interact with external devices and power. Generally, end users prefer a housing of smaller size so that the information handling system footprint has a minimal impact on a desktop area. In addition, end users generally prefer to have cables that couple to an information handling system organized in a manageable way that allows interaction with coupled peripherals without consuming excessive desktop space. Often desktop information handling systems are installed in a desktop environment and left in place until failure.

One recent innovation for installation of a desktop information handling system is to integrate the information handling system housing into a display stand. For example, the motherboard and processing components are built into a housing that fits within an opening formed in a display stand. When the information handling system is inserted in the display stand opening, a display stand cover placed over the information handling system housing secures it within the display stand and out of sight of the end user. An opening formed in the display stand housing provides a path to the information handling system for cable management while a graphics cable interface may be completely hidden from sight with cable routing through an internal pathway. Integrating an information handling system housing within a display stand that has a removeable cover allows replacement of the information handling system should a failure occur while keeping the display for continued use.

One difficulty with stowing an information handling system within a display stand is that end users may have some difficulty accessing the information handling system. The display stand should secure the information handling system in a robust manner yet have some readily understood access structure. Since a display stand is typically at a rear of a desktop and often against a wall, end users who attempt to open the display stand to access the information handling system will tend to have an awkward position. Excessive difficulty in finding and activating the latch can result in the display and/or information handling system falling or otherwise getting damaged.

SUMMARY OF THE INVENTION

Therefore, a need has arisen for a system and method which provides an information handling system housing split anchor automatic state holding latch.

In accordance with the present invention, a system and method are provided which substantially reduce the disadvantages and problems associated with previous methods and systems of enclosing an information handling system in a housing. A latch coupled to a first housing portion couples to a locking element of a second housing portion and moves from a locked position to an unlocked position to release from the locking element. An anchor coupled to a second housing portion engages the latch in the open position to maintain the open state until separation of the first housing portion from the second housing portion releases the latch from the anchor to return to a locked position.

More specifically, a display supported by a display stand presents visual images generated by a processor and memory that cooperate to process information. The display stand includes a cavity sized to accept the information handling system and a cover that couples over the cavity and held in place by a split anchor automatic state holding latch. The latch couples to the cover to slide between locked and unlocked positions to secure and release the cover from over the cavity. When the latch moves to the unlocked position, an anchor extends from within the cavity to engage the latch and maintain the latch in the unlocked position. Upon removal of the cover from over the cavity, the anchor separates from the latch to return the latch to the locked position. Replacing the cover over the cavity presses the latch at an inclined surface against the locking element at a parallel inclined surface to press the latch partially towards the open position at which the latch engages with the locking element. During insertion of the latch at the locking element, the latch moves less than the amount at which the anchor engages so that, upon insertion, the cover locks into place with the latch without the anchor holding the latch in the open position.

The present invention provides a number of important technical advantages. One example of an important technical advantage is that an information handling system is enclosed in a housing with a latch that provides automated locking, one-handed operation and a responsive feel. At release of the latch, the latch remains in the released state until removed from its opposing structure; however, as soon as the latch is removed from the opposing structure, it resets to secure into the opposing structure when placed back into position. Automated securing upon reinsertion into the opposing structure reduces the risk of damage that can occur if a latch is not closed properly. A smooth and constant force latch operation with low actuation force and high retention force is provided by separate retention and anchor spring actions. An anchor that engages the latch when initially released ensures that the latch remains released for one-handed housing separation.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

An information handling system couples into a display stand cavity with a cover held in place by a split anchor automatic state holding latch. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
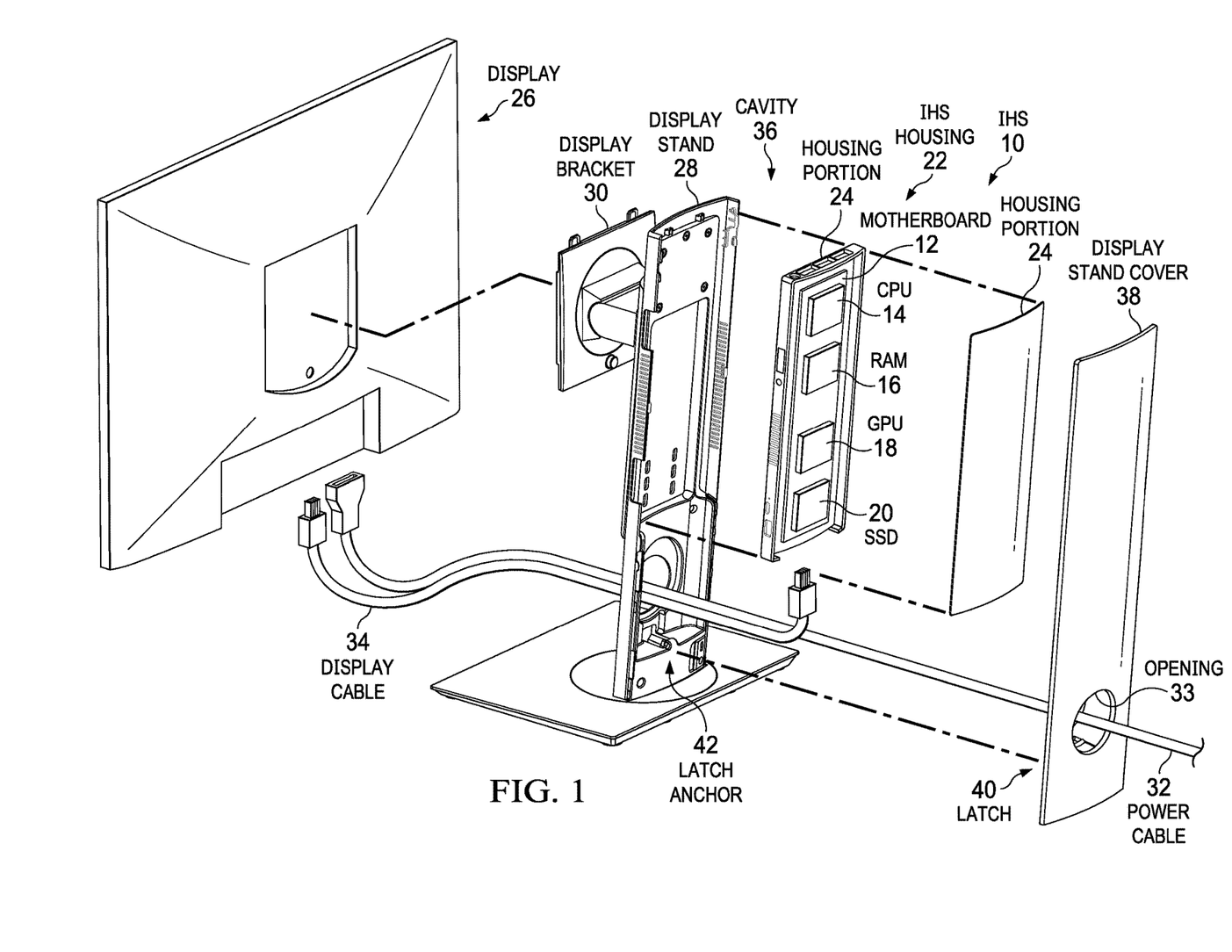
FIG. 1 depicts an exploded view of an information handling system configured to fit in a display stand cavity with a cover held in place by a split anchor automatic state holding latch.

Referring now to FIG. 1, an exploded view depicts an information handling system 10 configured to fit in a display stand 28 cavity 36 with a cover 38 held in place by a split latch anchor 42 automatic state holding latch 40. In the example embodiment, information handling system 10 processes information with processing components that communicate through a motherboard 12. For example, a central processing unit (CPU) 14 executes instructions stored in random access memory (RAM) 16 and retrieved from persistent memory of a solid state drive (SSD) 20 to generate visual information that a graphics processor unit (GPU) 18 applies to define visual images for presentation at a display 26. In the example embodiment, an information handling system housing 22 has separate housing portions 24 that couple to enclose motherboard 12. Once assembled into housing 22, information handling system 10 fits into a cavity 36 formed within display stand 28. Display stand 28 has a bracket 30 that couples to the back of display 26 to hold display 26 in a viewing position. A display stand cover 38 fits over cavity 36 to protect and hide information handling system 10 within display stand 28. A display cable 34 and power cable 32 route through an opening 33 defined in display stand 28 to provide power and visual information to display 26.

Once assembled, display stand 28 provides a convenient all-in-one information handling system assembly that contains information handling system 10 in a convenient manner. However, an end user may have some difficulty accessing information handling system 10 due to the small hidden disclosure and an infrequency of need. To provide an intuitive access a split latch anchor 42 automatic state holding latch 40 is integrated in cover 38 and cavity 36 within the opening through which cables 32 and 34 pass. When latch 40 is pressed into an unlocked position, anchor 42 holds latch 40 in the unlocked position until cover 38 is removed from cavity 36. Once cover 38 is removed, anchor 42 releases latch 40 to automatically return to a locked position. When cover 38 is replaced over cavity 36, latch 40 couples to a locking element within cavity 36 without engaging anchor 42. The split anchor and latch arrangement provides one handed release and reattachment of cover 38 that is intuitive and simple to use. Since latch 40 automatically resets at removal of cover 38, it will not reattach in an unlocked position or otherwise need an end user reconfiguration to a locked position to replace cover 38 over cavity 36. If an end user moves latch 40 to an unlocked position that engages anchor 42, then a slightly greater force applied to move latch 40 to the locked position overcomes anchor 42 without removing cover 38. Locking and unlocking latch 40 is performed with a one-handed operation.

Figure 2:
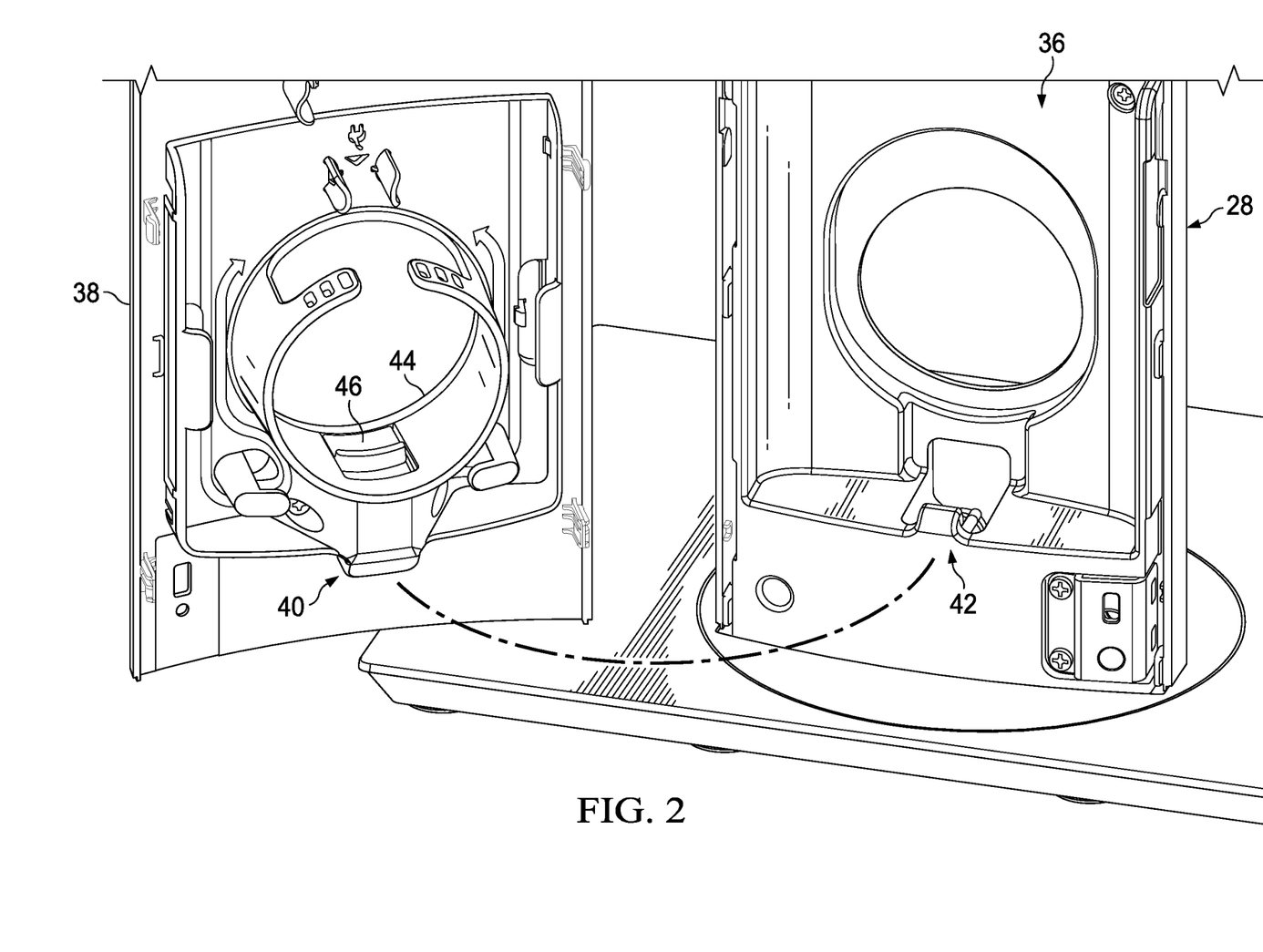
FIG. 2 depicts opposing sides of the split anchor automatic state holding latch integrated in a display stand cover and cavity.

Referring now to FIG. 2, opposing sides are depicted of the spit anchor 42 automatic state holding latch 40 integrated in a display stand 28 cover 38 and cavity 36. A cover cable guide 44 couples in the cable opening of display stand 28 to expose latch 40 activation button 46. When an end user places a finger into cable guide 44 and slides latch actuation button 46 towards anchor 42, once latch 40 reaches an unlocked position anchor 42 holds latch 40 in the unlocked position. With latch 40 unlocked, cover 38 may be removed from display stand 28 at the end user's convenience. Once cover 38 is removed, anchor 42 releases latch 40 so that latch activation button 46 biases back to the locked position. If an end user desires to re-assert latch 40 while anchor 42 holds the unlocked position, a slightly increased force applied in the locked position direction will overcome anchor 42 to lock latch 40. Separate attachment points for latch 40 and anchor 42 at opposing housing portions supports automated state holding and release for one-handed operation.

Figure 3:
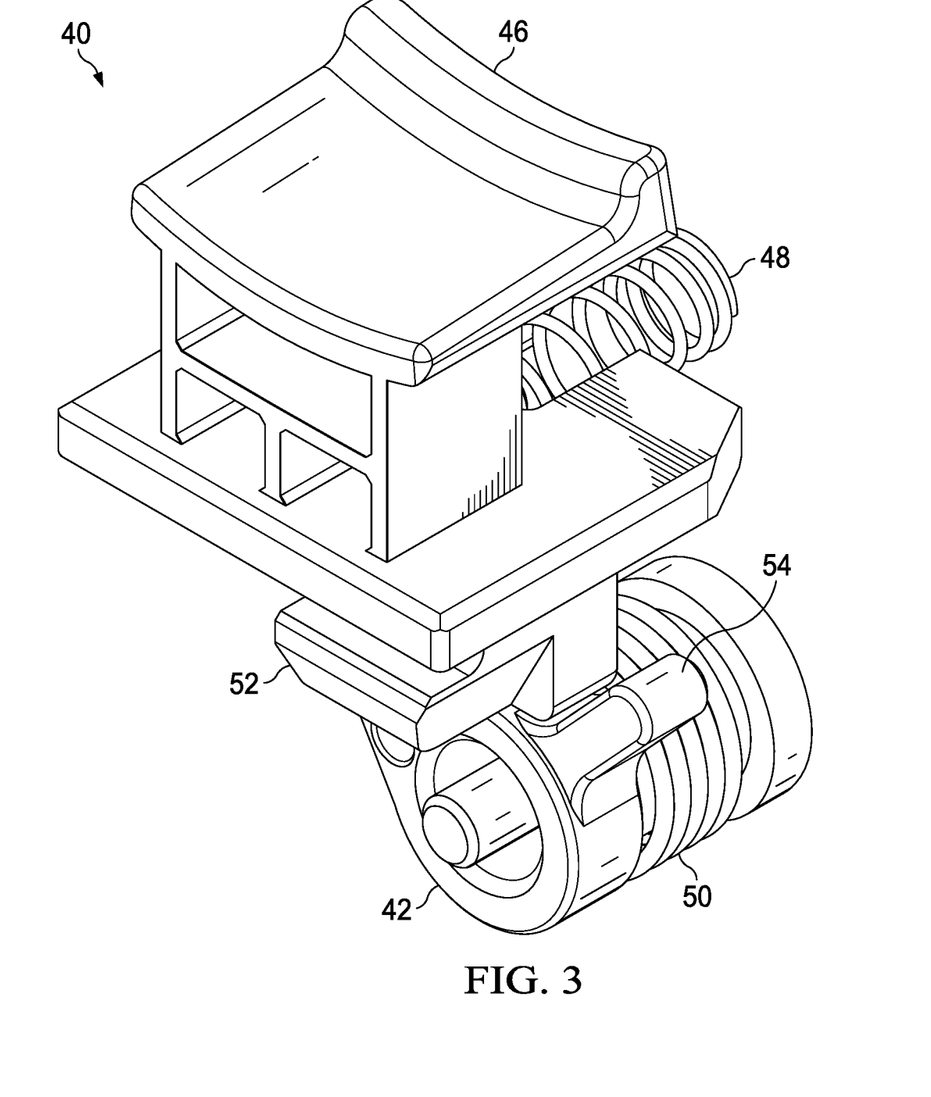
FIG. 3 depicts an isometric view of an example embodiment of a split anchor automatic state holding latch.
Figure 4:
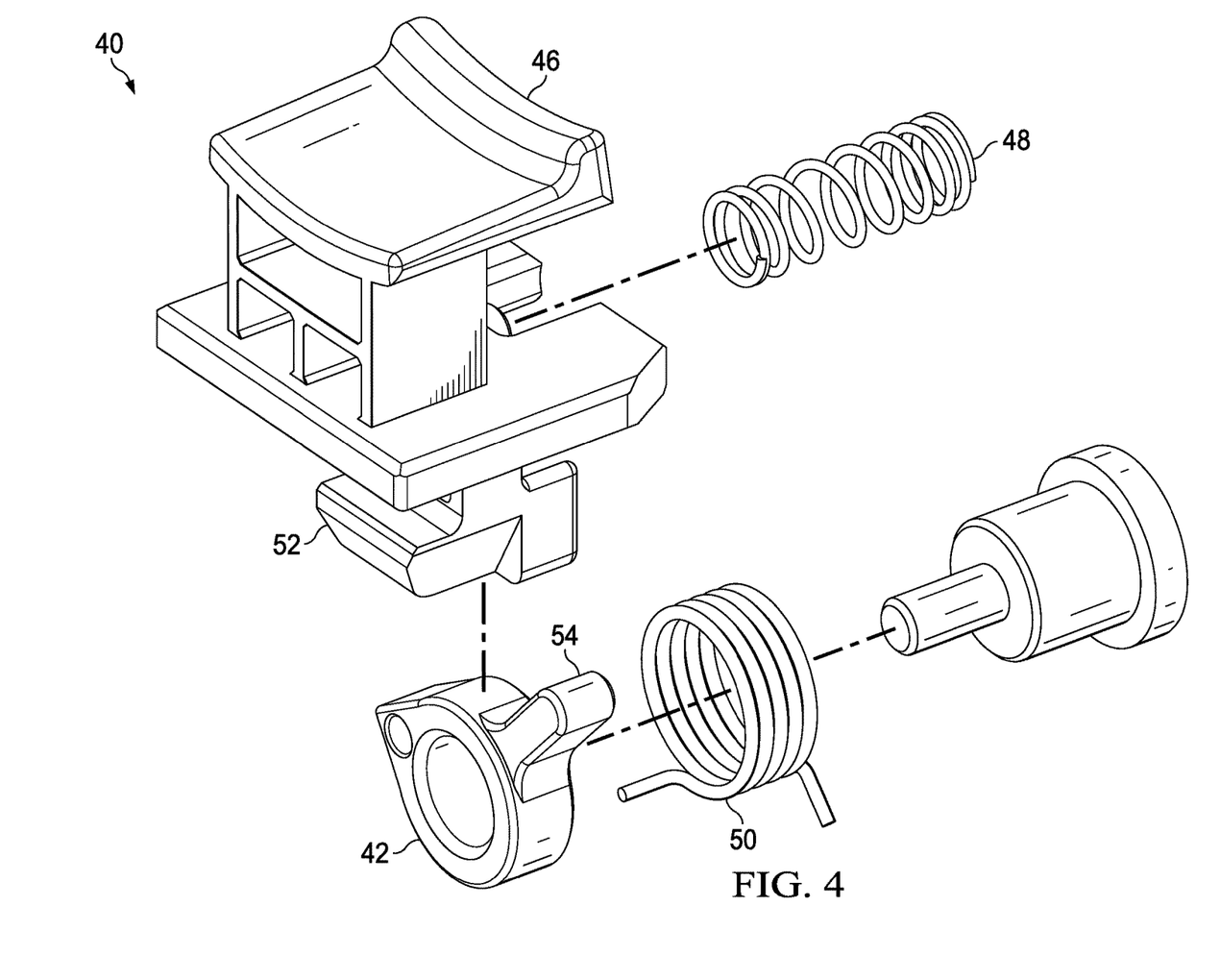
FIG. 4 depicts an exploded view of the example embodiment of the split anchor automatic state holding latch.

Referring now to FIG. 3, an isometric view depicts an example embodiment of a split latch anchor 42 automatic state holding latch 40. FIG. 4 depicts an exploded view of the example embodiment of the split latch anchor 42 automatic state holding latch 40. In the example embodiment, actuation button 46 extends upwards from within the cable cover guide, which engages in a sliding relationship to move between locked and unlocked positions. An actuation button spring 48 biases actuation button 46 to the locked position. Anchor 42 couples to the display stand within the cavity to extend upwards biased against a latch engagement surface 52 by an anchor spring 50. Latch engagement surface 52 has an inclined vertical surface that engages against a locking element at an upper surface and against anchor 42 at its lower surface. When latch actuation button 46 is pressed against latch actuation button spring 48, latch engagement surface 52 releases from the locking element within display stand 28 cavity 36 to release latch 40. Once latch actuation button is more fully pressed towards the unlocked position, the bottom surface of latch engagement surface 52 engages against anchor 42 by anchor spring 50 biasing anchor 42 upwards to hold latch actuation button 46 in the unlocked position against anchor engagement surface 54. If an end user pulls actuation button 46 away from actuation button spring 48, the inclined surface engagement of latch engagement surface 52 with anchor 42 engagement surface 54 allows release of actuation button 46 to the locked position. The amount of force to overcome anchor spring 50 is generally set larger than actuation button spring 48 since the normal manner of release of anchor 42 is to remove latch 40 from the cavity at which anchor 42 is coupled.

Figure 5A:
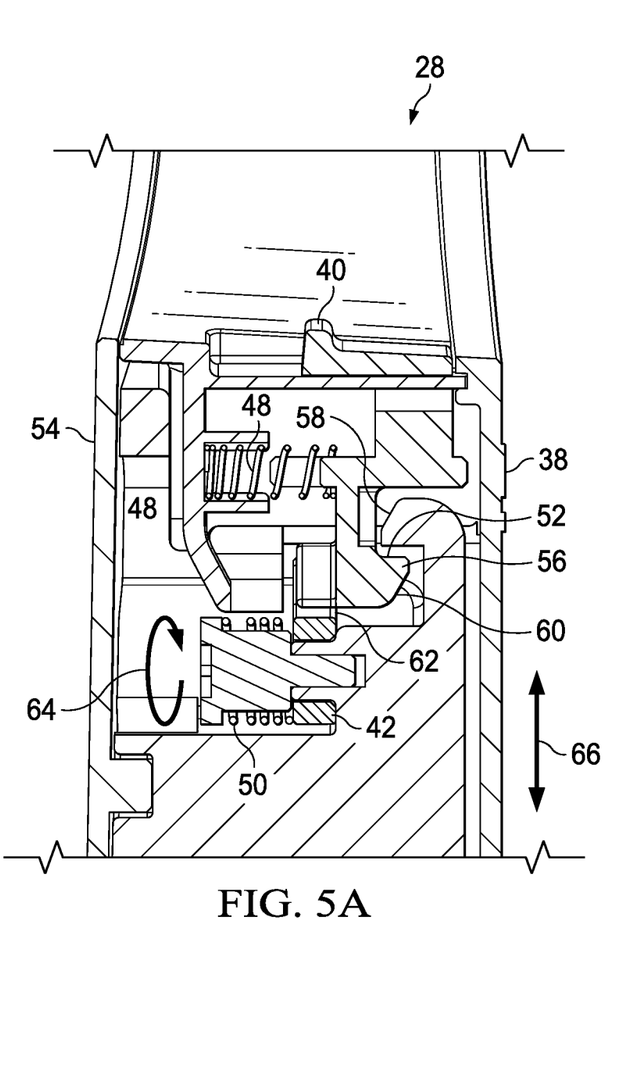
FIGS. 5A-5I depict a side cutaway view of an example split anchor automatic state holding latch activated from a secured position through a released position and back to the secured position.

Referring now to FIGS. 5A-5I, a side cutaway view depicts an example split latch anchor 42 automatic state holding latch 40 activated from a secured position through a released position and back to the secured position. FIG. 5A depicts latch 40 coupled to cover 38 to slide perpendicular to cover 38 with latch actuation button spring 48 biasing latch 40 towards cover 38 in the locked position. Latch engagement surface 52 is pressed under a locking element 56 formed in display stand 28, such as a lip that extends into cavity 36. Anchor 42 is pressed downward in a direction of travel that is perpendicular to latch 40 travel and compressed against anchor spring 50. A latch anchor locking element 62 formed in the bottom of latch 40 aligns with anchor 42 when latch 40 slides inward to the unlocked position. A latch sloped surface 60 and locking element sloped surface 58 work against each other during coupling of cover 38 to display stand 28, as indicated by arrow 66, so that latch 40 slides inwards until it fits under locking element 56. The amount of movement induced by engagement of latch sloped surface 60 and locking element sloped surface 58 is less than the distance needed to align anchor 42 with latch anchor locking element 62 so that anchor 42 will not engage latch 40 during attachment of cover 38 to display stand 28, as indicated by anchor movement arrow 64.

Figure 5B:
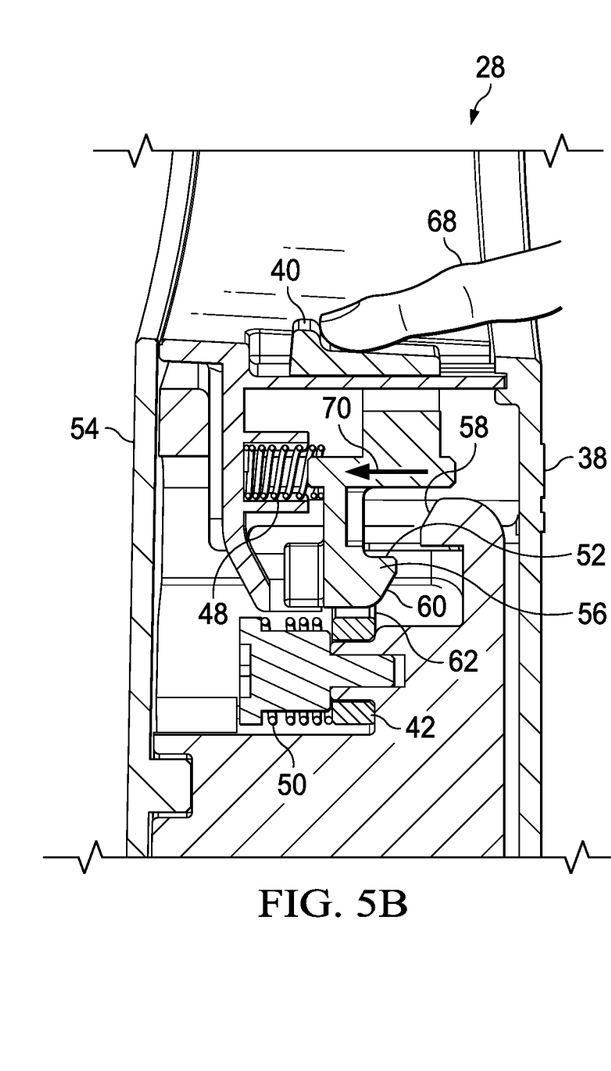
Figure 5C:
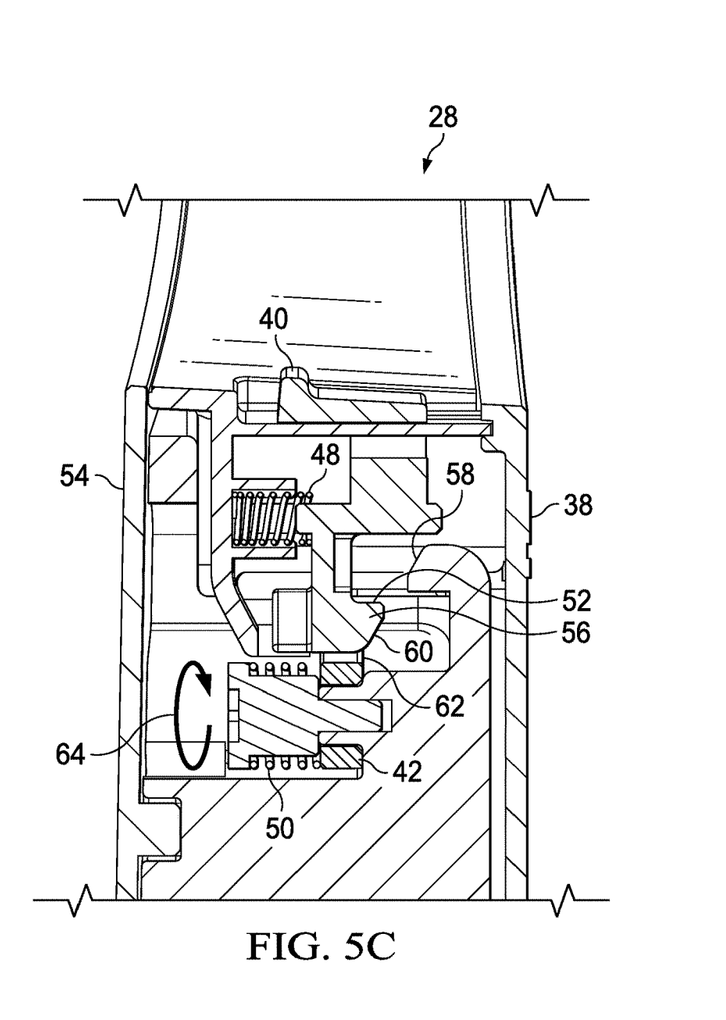
Figure 5D:
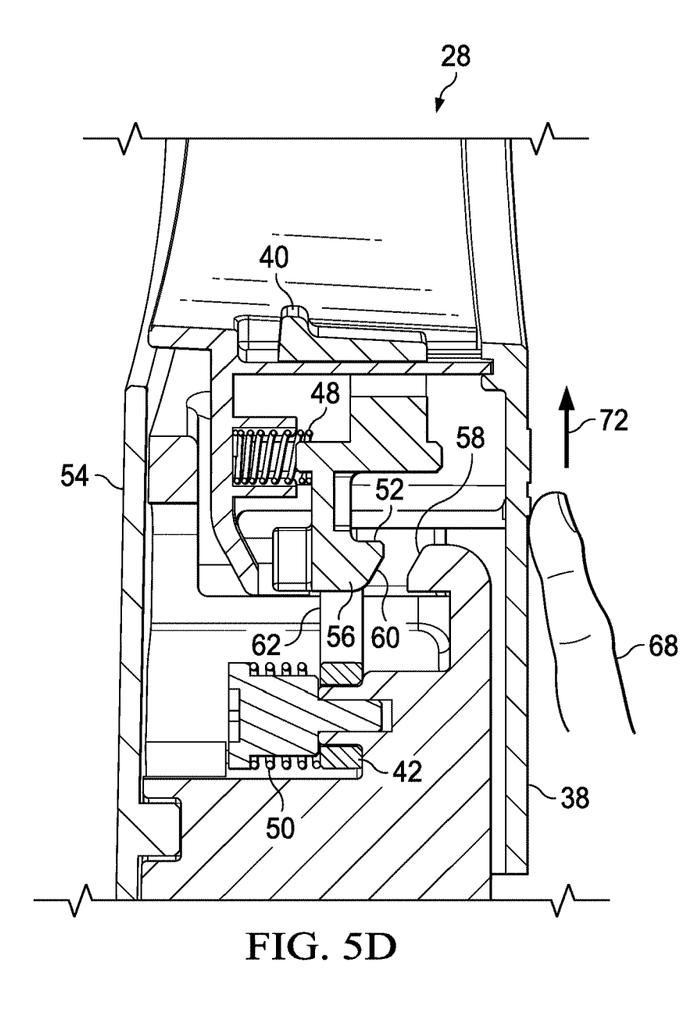
Figure 5E:
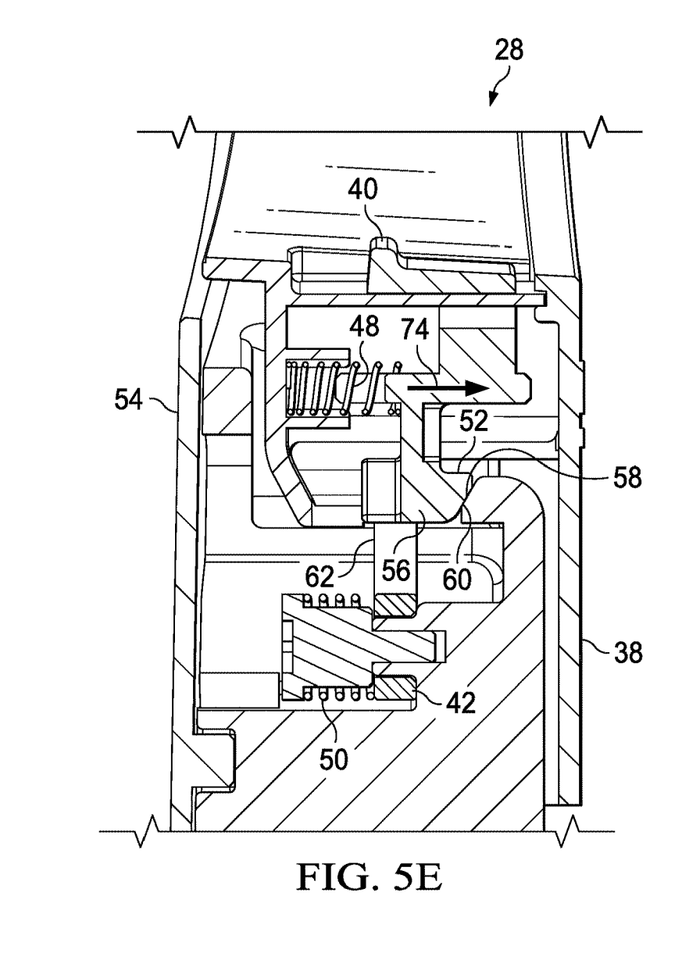

FIG. 5B depicts an end user activation of latch 40 with finger 68 sliding latch 40 to the unlocked position as indicated by arrow 70, which releasees latch engagement surface 52 from locking element 56. Continuing to FIG. 5C, in the unlocked position latch anchor locking element 62 aligns with anchor 42, which extends upwards to engage latch 40 and hold latch 40 in the unlocked state. FIG. 5D illustrates that an end user may lift cover 38 from display stand 28 with a motion of arrow 72 with one hand so that anchor 42 releases from latch 40. As shown by FIG. 5E, once anchor 42 releases from latch 40, latch 40 returns to the locked position as indicated by arrow 74 so that it is prepared to couple again to display stand 28.

Figure 5F:
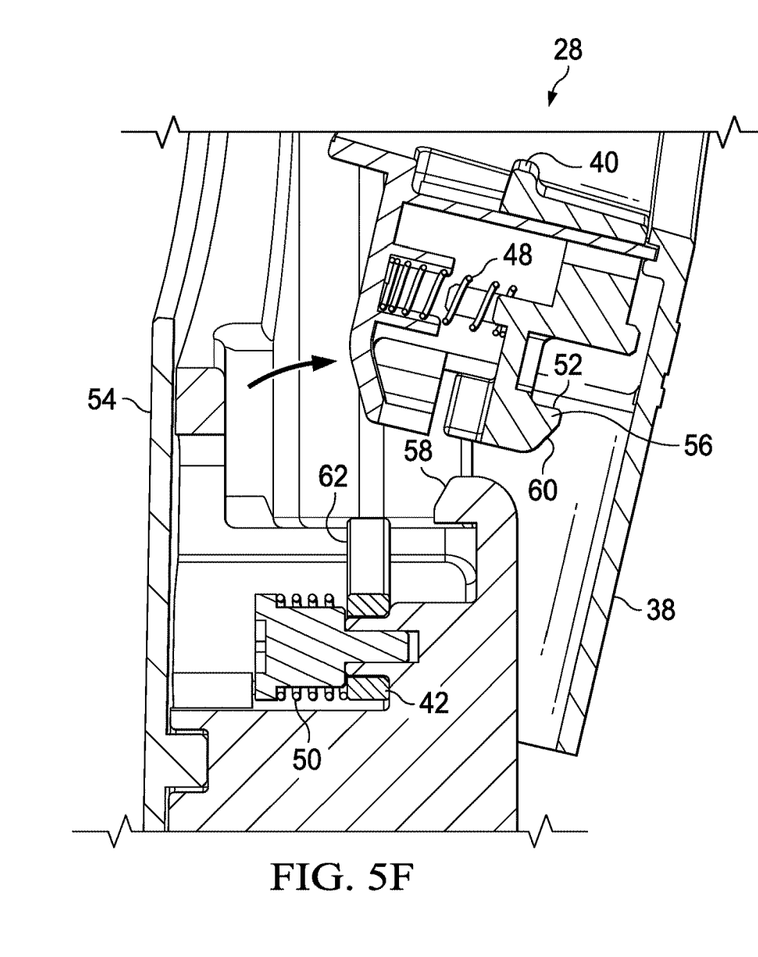
Figure 5G:
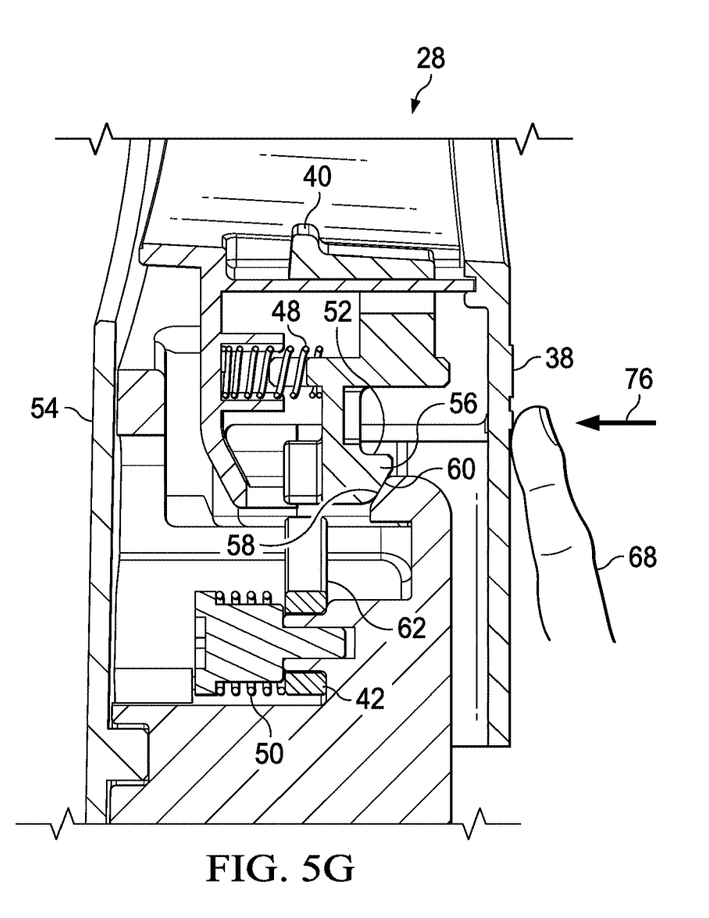
Figure 5H:
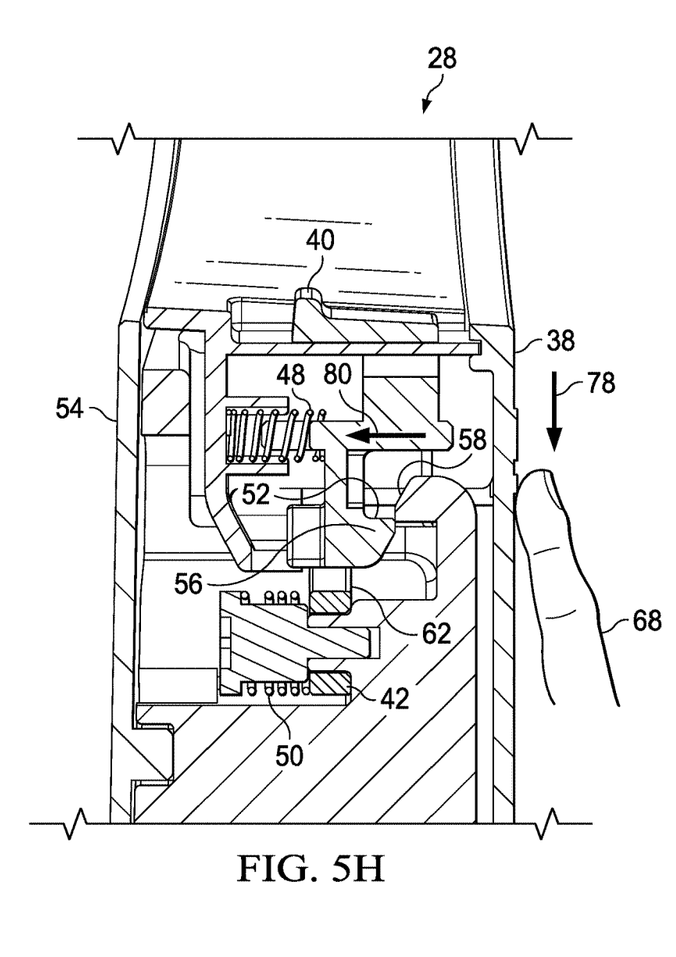
Figure 5I:
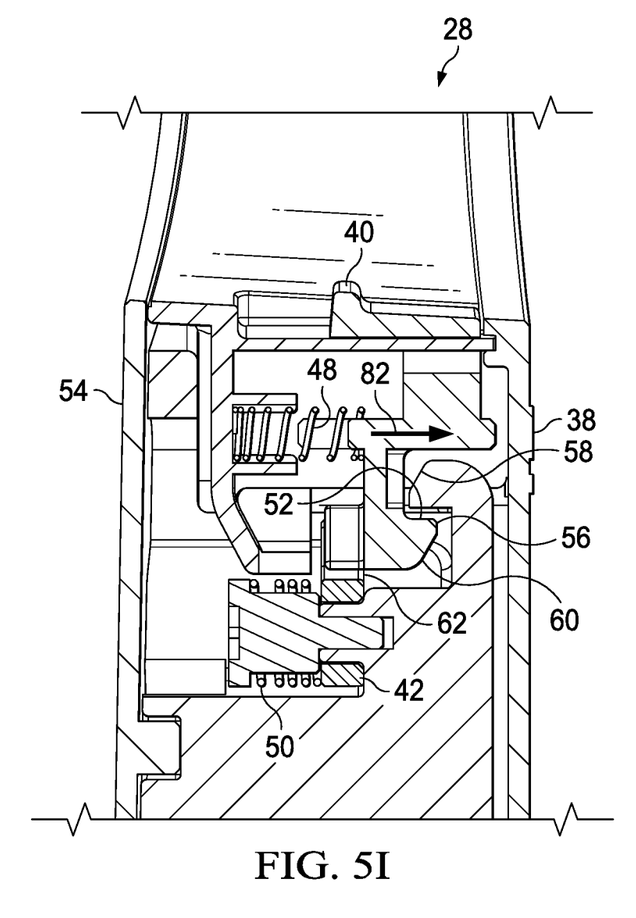

At FIG. 5F, cover 38 has completely separated from display stand 28 to allow end user access to cavity 36. To reattach cover 38, as illustrated by FIG. 5G, the end user aligns cover 38 with cavity 36 as indicated by arrow 76 so that latch sloped surface 60 and locking element sloped surface 58 press against each other. At FIG. 5H, the end user pushes cover 38 downward as indicated by arrow 78 to have latch 40 and locking element 56 parallel inclined surfaces work against each other until latch 40 fits under locking element 56 as indicated by arrow 80. Latch 40 and locking element 56 inclined surfaces move latch 40 towards the unlocked position but not a far enough distance to engage anchor 42. Anchor 42, if engaged, has rounded or inclined surfaces so that a sufficient force applied to latch 40 will press latch 40 to the locked position. At FIG. 5I, cover 38 is held in place by engagement of latch 40 with locking element 56 as latch 40 returns to the locked position as indicated by arrow 82.

Although the present invention has been described in detail, it should be understood that various changes, substitutions and alterations can be made hereto without departing from the spirit and scope of the invention as defined by the appended claims.

What is claimed is:

1. An information handling system comprising: a display disposed on a display stand, the display operable to present information as visual images, the display stand forming a cavity and having a removeable cover that fits over the cavity; a housing sized to fit into the cavity, the housing integrating a processor and memory that cooperate to process information; a latch coupled to the removeable cover and aligned to extend into the cavity when the cover fits over the cavity, the display stand forming an opening through the cavity to pass cables through and the latch is disposed within the opening;

the latch sliding between a locked and an unlocked position in a first direction; a latch anchor coupled to the display stand and disposed in the cavity aligned to engage the latch when moved to the unlocked position to retain the latch in the unlocked position, the latch anchor released from the latch when the cover lifts in a second direction perpendicular to the first direction and removes from the display stand;

and a locking element coupled to the housing in the cavity and aligned to engage the latch when in the locked position to hold the cover in place.

2. The information handling system of claim 1 further comprising:

a first spring engaged with the latch to bias the latch to the locked position; and a second spring engaged with the latch anchor to bias the latch anchor to engage with the latch.

3. The information handling system of claim 2 wherein the latch anchor and latch engage at an inclined surface so that a predetermined force applied at the latch towards the unlocked position releases the latch anchor from the latch.

4. The information handling system of claim 1 wherein the locking element comprises a lip extending from the display stand into the cavity and aligned to extend over the latch in the locked position.

5. The information handling system of claim 4 wherein the locking element and latch have parallel inclined surfaces that cooperate to slide the latch towards the unlocked position and under the locking element as the cover fits over the cavity.

6. The information handling system of claim 5 wherein the latch anchor engages the latch at an unlocked position of greater than a distance that the locking element and latch parallel inclined surfaces slide.

7. The information handling system of claim 6 wherein the latch anchor extends into the latch along an axis perpendicular to an axis of the latch motion between locked and unlocked positions.

8. The information handling system of claim 1 further comprising a cable guide coupled to the cover in the opening and having the latch integrated at a bottom surface.

9. A method for coupling first and second housing portions, the method comprising: coupling a latch of the first housing portion to a locking element of the second housing portion; sliding the latch from a locked position to an unlocked position that releases the latch from the locking element; engaging a latch anchor from the second housing portion into the latch to retain the latch in the unlocked position; and automatically releasing the anchor at separation of the first housing portion from the second housing portion to return the latch to the unlocked position; and biasing the latch towards the locked position with a first spring integrated with the latch in the first housing portion; and biasing the anchor towards engagement with the latch with a second spring integrated in the second housing portion; and engaging the anchor and latch at an inclined surface; and overriding the anchor when a predetermined force is applied to move the latch from the unlocked position to the locked position.

10. The method of claim 9 further comprising:
replacing the first housing portion at the second housing portion;
engaging an inclined surface of the latch with an inclined surface of the locking element to move the latch from the locked position towards the unlocked position; and
releasing the inclined surface of the latch and the inclined surface of the locking element to engage the latch and locking element before the anchor engages the latch.

11. The method of claim 10 wherein:
the second housing portion comprises a display having a display stand, the display stand having a cavity; and
the first housing portion comprises a cover that fits over the cavity.

12. The method of claim 11 further comprising:
removing the cover to expose the cavity;
inserting an information handling system in the cavity; and
coupling the cover over the information handling system with the latch.

13. The method of claim 12 further comprising:
disposing the latch in an opening formed in the cover and display stand; and
routing a power cable through the opening to couple with the display.

14. A state holding coupling device comprising: a latch coupled to a first housing portion, the latch moving along a first axis between a locked position and an unlocked position; a locking element coupled to a second housing portion and aligned to engage the latch in the locked position to couple the first and second housing portions to each other in a coupled position; and an anchor coupled to the second housing portion and moving along a second axis, the anchor engaging the latch in the unlocked position to hold the latch in the unlocked position when the first and second housing portions remain in the coupled position; and the anchor releases from the latch at removal of the first and second housing portions from the coupled position; and the first and second axes are substantially perpendicular.

15. The state holding couple device of claim 14 wherein the anchor and latch engage along an inclined surface that releases the anchor in response to at least a predetermined force applied to the latch towards the unlocked position.

* * * * *